United States Patent [19]
Watanabe

[11] Patent Number: 6,077,382
[45] Date of Patent: Jun. 20, 2000

[54] MOUNTING METHOD OF SEMICONDUCTOR CHIP

[75] Inventor: Makoto Watanabe, Tokorozawa, Japan

[73] Assignee: Citizen Watch Co., Ltd, Tokyo, Japan

[21] Appl. No.: 09/074,425

[22] Filed: May 8, 1998

[30] Foreign Application Priority Data

May 9, 1997 [JP] Japan ................................. 9-119216
Jul. 16, 1997 [JP] Japan ................................. 9-190868

[51] Int. Cl.[7] ............................ B32B 31/00; H01L 21/52
[52] U.S. Cl. ........................... 156/322; 29/832; 156/299
[58] Field of Search ................................ 156/292, 299, 156/311, 322, 309.9; 438/108, 119; 29/829, 832, 834

[56] References Cited

U.S. PATENT DOCUMENTS

| | | | |
|---|---|---|---|
| 4,749,120 | 6/1988 | Hatada | 228/123.1 |
| 5,148,266 | 9/1992 | Khandros et al. | 257/773 |
| 5,232,532 | 8/1993 | Hori | 29/832 X |
| 5,283,947 | 2/1994 | Santo et al. | 29/832 X |
| 5,628,111 | 5/1997 | Iwasaki et al. | 29/841 |
| 5,802,712 | 9/1998 | Sakai et al. | 29/840 |
| 5,843,251 | 12/1998 | Tsukagoshi et al. | 29/832 X |

FOREIGN PATENT DOCUMENTS 7-066225  3/1995  Japan ............................. H01L 21/52

*Primary Examiner*—Michael W. Ball
*Assistant Examiner*—John T. Haran
*Attorney, Agent, or Firm*—Armstrong, Westerman, Hattori, McLeland and Naughton

[57] ABSTRACT

The invention provides a mounting method for a semiconductor chip, wherein after disposing the anisotropic conductive adhesive on a circuit board, the circuit board is preheated to a temperature lower than the hardening temperature of the anisotropic conductive adhesive, the semiconductor chip is disposed on the circuit board thereafter, and the anisotropic conductive adhesive is hardened by thermally press-bonding the semiconductor chip onto the circuit board by applying pressure as well as heat so that generation of air bubbles is minimized ensuring good adhesion therebetween. It is also possible to prevent occurrence of thermal strain by heating simultaneously the under surface of the circuit board at a temperature lower than a heating temperature for the semiconductor chip.

3 Claims, 7 Drawing Sheets

PRIOR ART

MOUNTING METHOD OF SEMICONDUCTOR CHIP

BACKGROUND OF THE INVENTION

1. Field of the Invention

The invention relates to a method for mounting a semiconductor chip provided with bump electrodes on a circuit board with wiring patterns formed thereon, and particularly, to a method for fixing a semiconductor chip to the circuit board with the use of an anisotropic conductive adhesive while connecting the bump electrodes of the semiconductor chip to the wiring patterns on the circuit board.

2. Description of the Related Art

A method for mounting a semiconductor chip (device) for driving liquid crystals on, for example, a glass substrate of a liquid crystal panel cell by use of an anisotropic conductive adhesive has already been put to commercial use.

Such a conventional method for mounting the semiconductor chip is described hereinafter with reference to FIG. 5 showing a plan view, FIG. 6 showing a sectional view taken along the line A—A of FIG. 5, and FIGS. 7-1 to 7-4 sectional views similar to FIG. 6, showing respective steps in the method for mounting the semiconductor chip.

As shown in FIG. 5, a liquid crystal display has a construction wherein wiring patterns 15 for outputting signals to the display thereof are formed on blank spaces 16 of a first substrate 11 and a second substrate 12, respectively, making up a circuit board of a liquid crystal panel cell, so that a plurality of semiconductor chips 13 for driving liquid crystals can be mounted on the wiring patterns 15.

As material for the wiring patterns 15, a transparent and electrically conductive film such as an indium tin oxide (ITO) film, tin oxide film, or the like, is used.

As shown in FIG. 6, the semiconductor chip 13 to be mounted on the blank spaces 16 of the substrates 11, 12, with the wiring patterns 15 formed thereon, is adhered thereto, respectively, by means of an anisotropic conductive adhesive 18.

The anisotropic conductive adhesive 18 is an insulating epoxy-based adhesive mixed with metal particles of silver, solder, or the like, 5 to 10 μm in grain size, or mixed with electrically conductive particles 18a such as plastic particles rendered electrically conductive by plating the surface thereof with gold, or the like.

The wiring patterns 15 are rendered electrically continuous with bump electrodes 14 provided on the semiconductor chip 13, opposite to the wiring patterns 15, respectively, by interposing therebetween the electrically conductive particles 18a contained in the anisotropic conductive adhesive 18.

An anisotropic conductive film (ACF) 180 sandwiched between a base film 181 and a cover film 182 as shown in FIG. 11 is available as the anisotropic conductive adhesive 18 in the form of a film. The ACF 180 is an adhesive layer composed of thermosetting epoxy resin, containing a plurality of the electrically conductive particles 18a.

As shown in FIG. 12, the electrically conductive particles 18a are spherical in shape and on the order of 5 μm in diameter. A gold plated layer 18a2 is formed on the surface of a plastic core 18a1 thereof, and the surface of the gold plated layer 18a2 is further covered with an insulation layer 18a3.

Accordingly, the electrically conductive particles 18a are insulated from each other within the ACF 180. The ACF 180 sandwiched depthwise between electrically conductive members, when heated and compressed, becomes electrically conductive due to destruction of the insulation layer 18a3 of the electrically conductive particles 18a. However, conduction of electricity does not occur in the lateral direction of the ACF 180 because the insulation layer 18a3 of the electrically conductive particles 18a present in lateral regions is not destroyed.

Steps in the conventional method for mounting a semiconductor chip are described hereinafter with reference to FIGS. 7-1 to 7-4.

In Step 1, as shown in FIG. 7-1 the anisotropic conductive adhesive 18 is transferred to and disposed on portions of the blank spaces 16 of the substrate 12, where the semiconductor chip 13 is to be mounted.

For example, after the cover film 182 shown in FIG. 11 is peeled off and the ACF 180 is pasted on the substrate 12, the base film 181 is peeled off.

Subsequently, in Step 2, as shown in FIG. 7-2, after aligning the bump electrodes 14 of the semiconductor chip 13 with the wiring patterns 15 facing the bump electrodes 14, the semiconductor chip 13 is disposed on the substrate 12, with the anisotropic conductive adhesive 18 interposed therebetween.

In Step 3 as shown in FIG. 7-3 thereafter, by use of a heating and pressing jig 19 provided with a heater 19a built therein, the semiconductor chip 13 is thermally pressbonded to the second substrate 12 by heating while applying pressure, hardening the anisotropic conductive adhesive 18.

In Step 4 as shown in FIG. 7-4 with the anisotropic conductive adhesive 18 hardened in the preceding step, the semiconductor chip 13 is adhered to the substrate 12, thereby clamping a plurality of the electrically conductive particles 18a between the bump electrodes 14 of the semiconductor chip 13 and the wiring patterns 15 over the substrate 12, opposite thereto, respectively, with the result that the respective bump electrodes 14 are rendered electrically continuous with the respective wiring patterns 15.

As the anisotropic conductive adhesive 18 is an insulating epoxy-based adhesive with the electrically conductive particles 18a dispersed therein, or as with the case of ACF 180 shown in FIGS. 11 and 12, the spherical surface of the respective electrically conductive particles 18a is covered with the insulation layer 18a3, the electrically conductive particles 18a, other than those clamped between the bump electrodes 14 and the wiring patterns 15, are insulated from each other. Accordingly, there is no possibility of short-circuit occurring between the individual bump electrodes 14 themselves, or between the independent wiring patterns 15.

In the conventional method for mounting the semiconductor chip described above, however, air bubbles involving volatile constituents (diluent, moisture, and the like) contained in the anisotropic conductive adhesive 18, air, and the like are formed between the semiconductor chip 13 and the substrate 12 when hardening the anisotropic conductive adhesive 18 by heating.

Thus, as shown in FIG. 8, air bubbles 21 are formed on the surface of the epoxy-based adhesive material of the anisotropic conductive adhesive 18 between the semiconductor chip 13 and substrate 12, where adhesion is to take place.

As a result, the epoxy based adhesive material of the anisotropic conductive adhesive 18 cannot be fully filled between the semiconductor chip 13 and substrate 12, impairing adhesion strength. This has caused a problem of electrical continuity between the bump electrodes 14 and wiring patterns 15 being disrupted at times due to exfoliation of the semiconductor chip 13 from the substrate 12.

Further, after the semiconductor chip 13 is press-bonded to the substrate 12 by heating, the semiconductor chip 13 and substrate 12 will be found in a condition wherein thermal strain occurs therebetween.

In comparing the thermal expansion coefficient of, for example, a borosilicate glass substrate often used for the substrate 12 of the liquid crystal panel cell with that of the semiconductor chip 13 composed primarily of silicon, the glass substrate has a higher thermal expansion coefficient. Accordingly, when the temperature of the anisotropic conductive adhesive 18 declines to room temperature after the semiconductor chip 13 has been press-bonded to the substrate 12 by heating and the anisotropic conductive adhesive 18 has been hardened, the difference in thermal expansion coefficient between the semiconductor chip 13 and substrate 12 causes a difference in shrinkage to occur between materials making up respective members.

FIG. 9 shows the relationship between amounts of thermal expansion and heating temperatures with respect to a borosilicate glass substrate and a semiconductor chip. The thermal expansion coefficient of the borosilicate glass substrate, $\alpha$ glass, is expressed as follows:

$$\alpha \text{ glass}=51\times10^{-7}/°C.$$

On the other hand, the thermal expansion coefficient of the semiconductor chip composed primarily of silicon, $\alpha$ IC, is expressed as follows:

$$\alpha \text{ } IC=24.2\times10^{-7}/°C.$$

That is, the first and second substrates 11, 12 shown in FIGS. 5 to 7, which are glass substrates, have thermal expansion coefficients twice as high as that of the semiconductor chip 13.

When a temperature difference of $\Delta T$ is applied to a material 1 meter long and having thermal expansion coefficient $\alpha$, elongation L (m) of the material is generally found by the following formula:

$$L=\alpha\times1\times\Delta T.$$

Assuming that the anisotropic conductive adhesive 18 is cured at 210° C., the semiconductor chip 13 needs to be heated to a temperature on the order of 250° C. Further, the duration of press-bonding is in the range of 5 to 10 seconds.

With the duration of press-bonding ranging from 5 to 10 seconds, the temperature on the side of the substrate 12 rises to only around 100° C.

The elongation occurring to the substrate (glass substrate) 12 and the semiconductor chip 13, respectively, is calculated hereinafter assuming that room temperature is 20° C.

Assuming further that a semiconductor chip has a side 15 mm long, and the elongation caused by thermal expansion occurs bisymmetrically, calculation of the elongation is made for one half of respective members on one side only.

Then, the elongation of the substrate 12 is found by the following formula:

(15 mm÷2)×51×10$^{-7}$×(100° C.−20° C.)=0.0030600 mm.

On the other hand, the elongation of the semiconductor chip is found by the following formula:

(15 mm÷2)×24.2×10$^{-7}$×(250° C.−20° C.)=0.0041745 mm.

Accordingly, the discrepancy in the elongation between the substrate 12 and the semiconductor chip 13 amounts to the value given below, indicating that the semiconductor chip 13 is further elongated by about 1 $\mu$m:

0.0041745−0.0030600 mm=0.0011145 mm.

If respective materials are left as they are after the temperatures thereof are allowed to come down to room temperature at 20° C. with such a difference in elongation therebetween as described remaining, thermal strain will occur on bonded surfaces of the semiconductor chip 13 and substrate 12 (more specifically, between the bump electrodes 14 and the wiring patterns 15, and between the semiconductor chip 13 and substrate 12) due to a difference in shrinkage therebetween, causing a problem of exfoliation.

FIG. 10 shows the relationship between temperatures of the borosilicate glass substrate and strain in the semiconductor chip for driving liquid crystals when heated to 250° C. in relation to the glass substrate.

SUMMARY OF THE INVENTION

The invention has been developed in order to solve such problems described above as encountered in carrying out the conventional method for mounting a semiconductor chip using an anisotropic conductive adhesive. More specifically, it is an object of the invention to provide a highly reliable method for mounting a semiconductor chip on a circuit board whereby generation of air bubbles between the semiconductor chip and circuit board is inhibited, and exfoliation of the semiconductor chip from the circuit board and poor electrical continuity between bump electrodes and wiring patterns are prevented by eliminating the difference in elongation between the semiconductor chip and circuit board after thermal press-bonding of the former to the latter.

To this end, in the method for mounting the semiconductor chip on the circuit board according to the invention, the circuit board with the anisotropic conductive adhesive disposed thereon is preheated to a temperature lower than the hardening temperature of the anisotropic conductive adhesive after disposing the anisotropic conductive adhesive on the circuit board, but before disposing the semiconductor chip on the circuit board.

Volatile constituents contained in the anisotropic conductive adhesive are evaporated by preheating the circuit board with the anisotropic conductive adhesive disposed thereon so that very few air bubbles are generated when the semiconductor chip is thermally press-bonded. As a result, the amount of air bubbles generated between the semiconductor chip and the circuit board is dramatically reduced, enabling highly reliable mounting of the semiconductor chip.

The invention also proposes that in a step of hardening the anisotropic conductive adhesive by thermally press-bonding the semiconductor chip to the circuit board by applying pressure as well as heat, and a surface of the circuit board on the opposite side of a surface thereof with the semiconductor chip disposed thereon, is also heated to a temperature lower than a temperature to which the semiconductor chip is heated.

The amount of thermal expansion of the circuit board can be rendered substantially equal to that of the semiconductor chip by thus adjusting the temperature of the circuit board by heating the same as well, thereby preventing thermal strain from occurring between the circuit board and the semiconductor chip when the temperatures of the circuit board and the semiconductor chip return to room temperature after thermal press-bonding.

Accordingly, exfoliation of the semiconductor chip from the circuit board and poor electrical continuity between bump electrodes and wiring patterns can be prevented, attaining highly reliable mounting.

It is thus possible to provide a reliable mounting method wherein generation of air bubbles is substantially eliminated and strain between the circuit board and the semiconductor chip is inhibited by applying both the step of preheating the circuit board with the anisotropic conductive adhesive disposed thereon to a temperature lower than the hardening temperature of the anisotropic conductive adhesive, and the step of heating the surface of the circuit board on the opposite side of the surface thereof with the semiconductor chip disposed thereon, to a temperature lower than the temperature to which the semiconductor chip is heated, during the step of hardening the anisotropic conductive adhesive.

The above and other objects, features, and advantages of the invention will be apparent from the following detailed description which is to be read in conjunction with the accompanying drawings.

BRIEF DESCRIPTION OF THE DRAWINGS

FIG. 2 is a plan view showing the condition of air bubbles generated in an anisotropic conductive adhesive when the first embodiment of the invention is carried out;

FIG. 3 is a diagram showing variation with time of the value of contact resistance in a reliability test run on samples prepared by a conventional mounting method and the mounting method according to the invention, respectively;

FIGS. 4-1 to 4-4 are sectional views, similar to FIG. 6, showing respective steps in the method for mounting a semiconductor chip according to a second embodiment of the invention;

FIGS. 7-1 to 7-4 are sectional views, similar to FIG. 6, showing respective steps in a conventional mounting method for a semiconductor chip;

DETAILED DESCRIPTION OF THE PREFERRED EMBODIMENTS

Preferred embodiments of the method for mounting a semiconductor chip according to the invention are described hereinafter in detail with reference to accompanying drawings.

In explaining the embodiments hereinafter, a method for mounting a semiconductor chip (device) for driving liquid crystals on a glass substrate of a liquid crystal panel cell, as with the case of the conventional method previously described with reference to FIGS. 5 to 7-4, is described by way of example.

Figure 1:
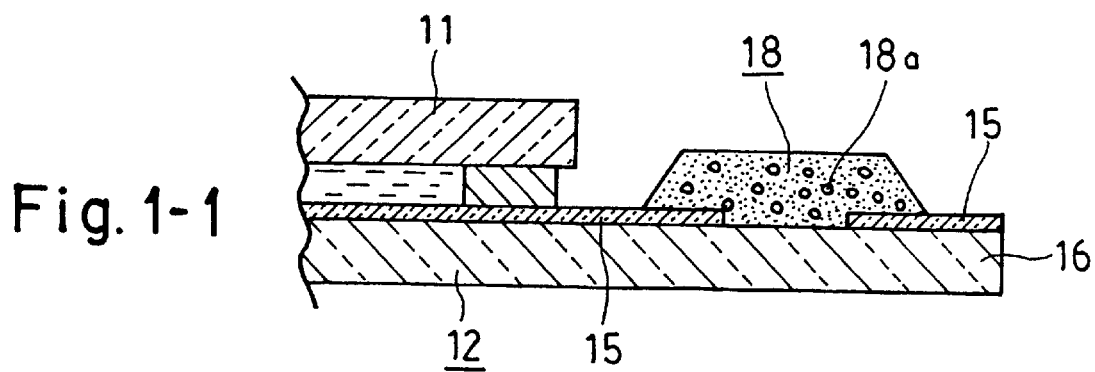
FIGS. 1-1 to 1-4 are sectional views, similar to FIG. 6, showing respective steps in the method for mounting a semiconductor chip according to the first embodiment of the invention.
Figures 1, 2:
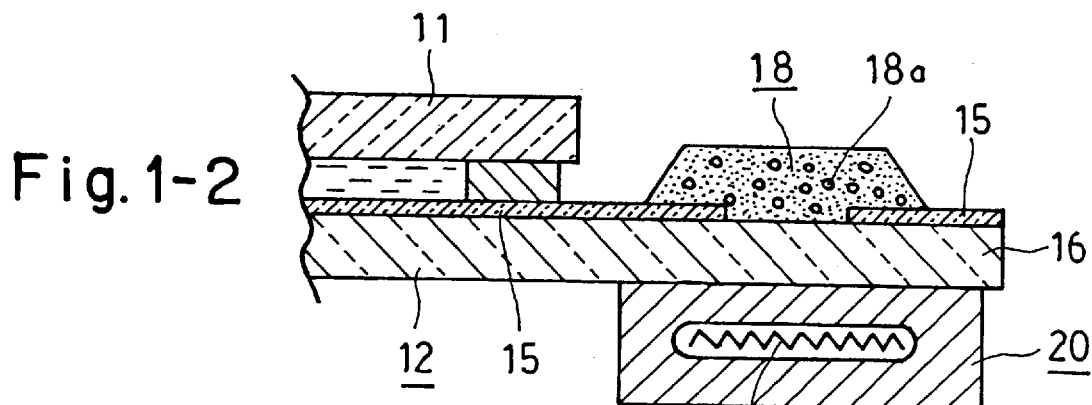
Figures 1, 2, 3:
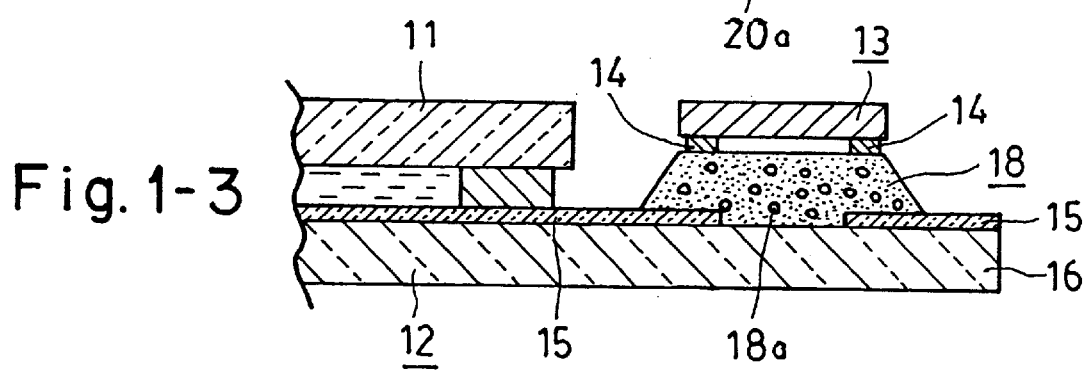
Figures 1, 2, 3, 4:
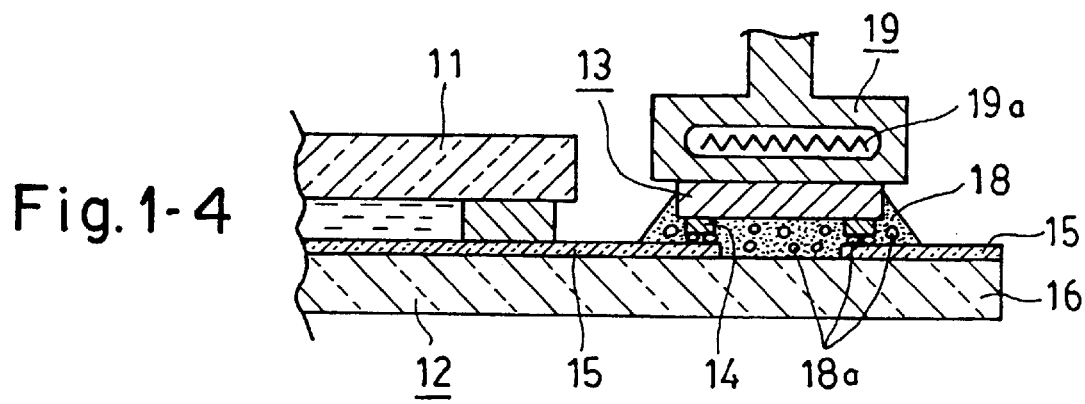
Figure 2:
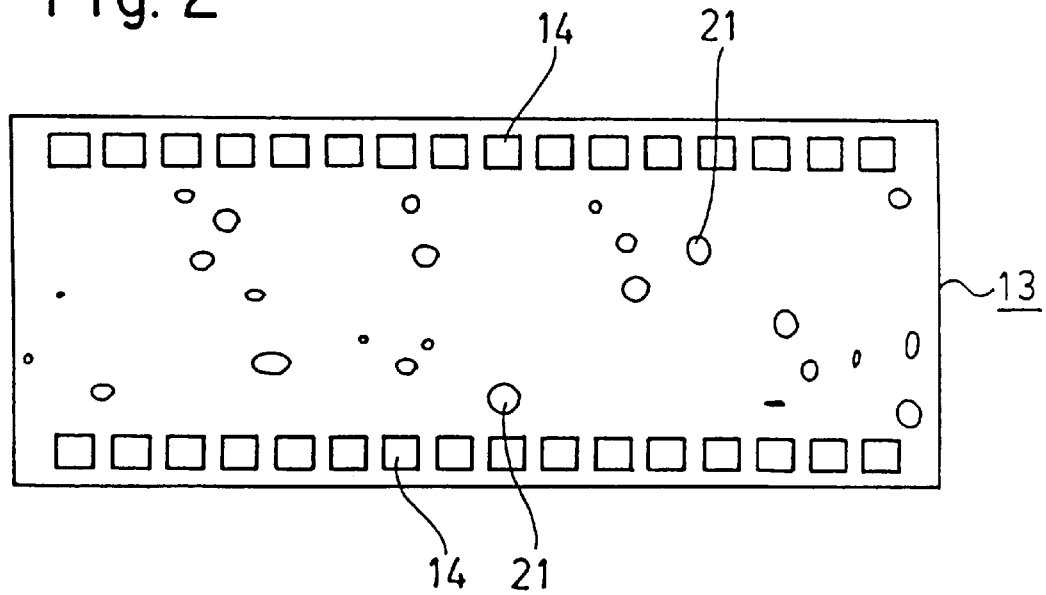
Figure 3:
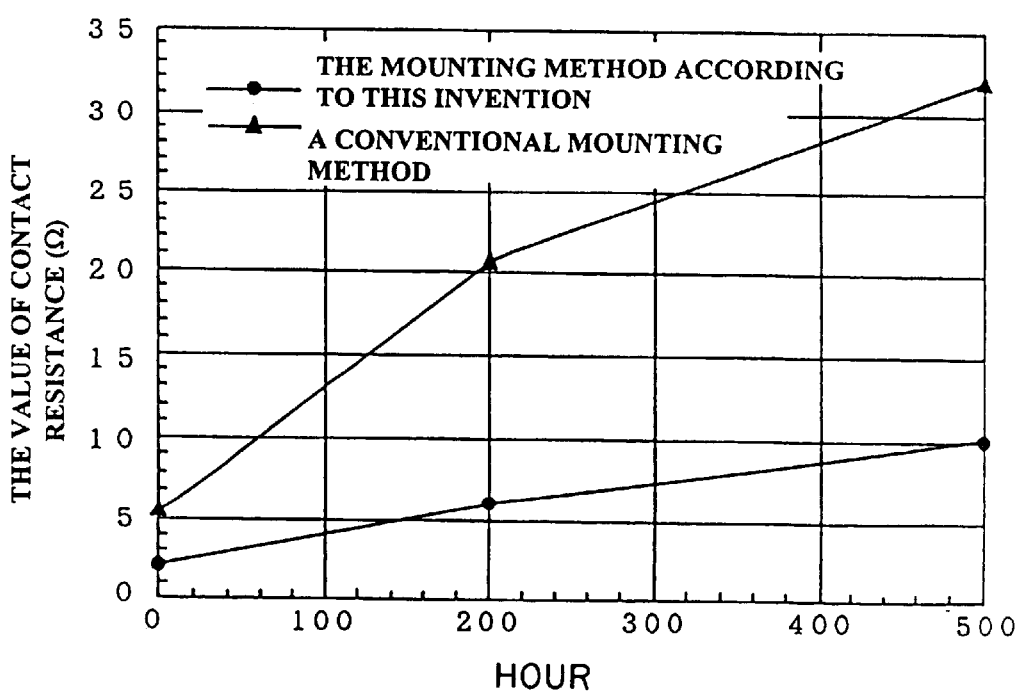
Figures 1, 4:
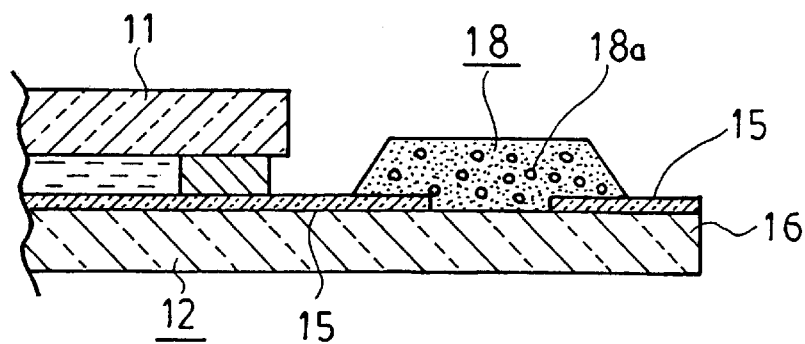
Figures 2, 4:
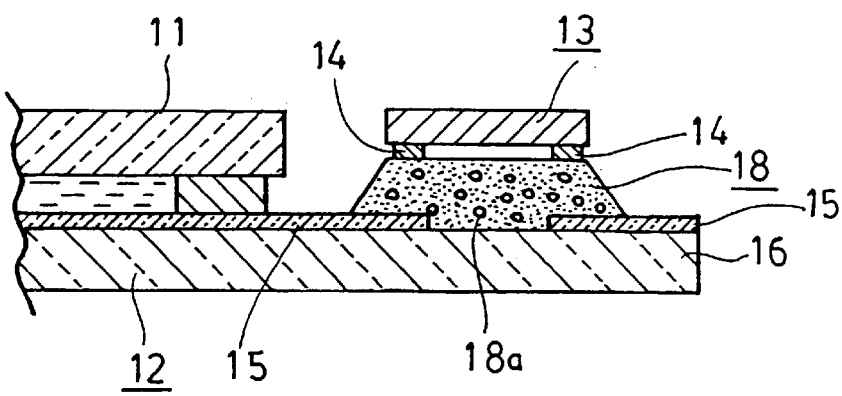
Figures 3, 4:
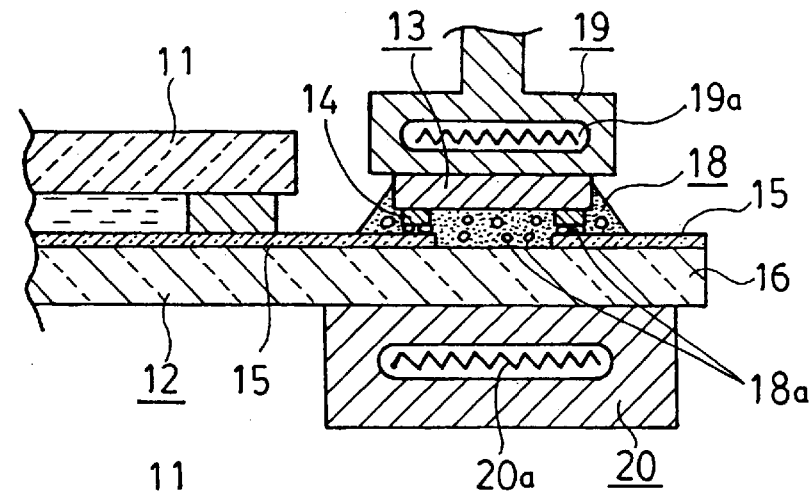
Figure 4:
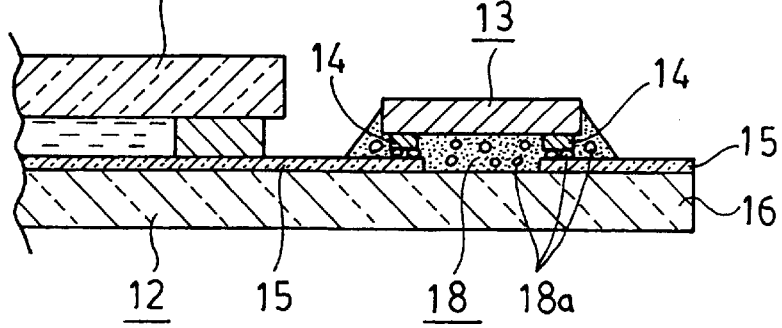
Figures 1, 7:
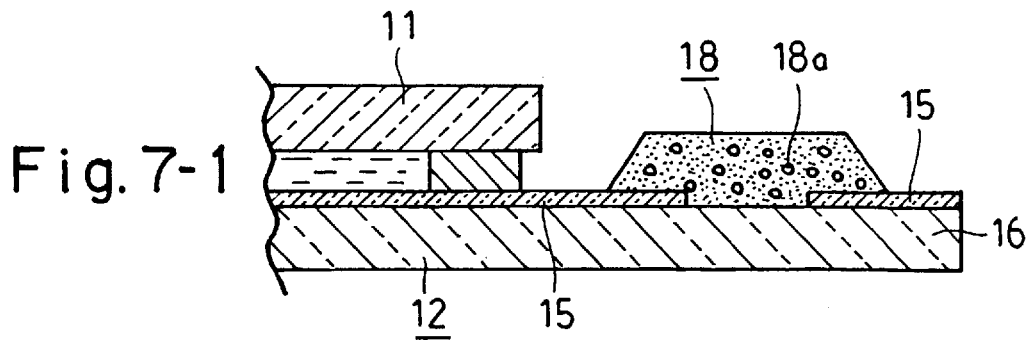
Figures 2, 7:
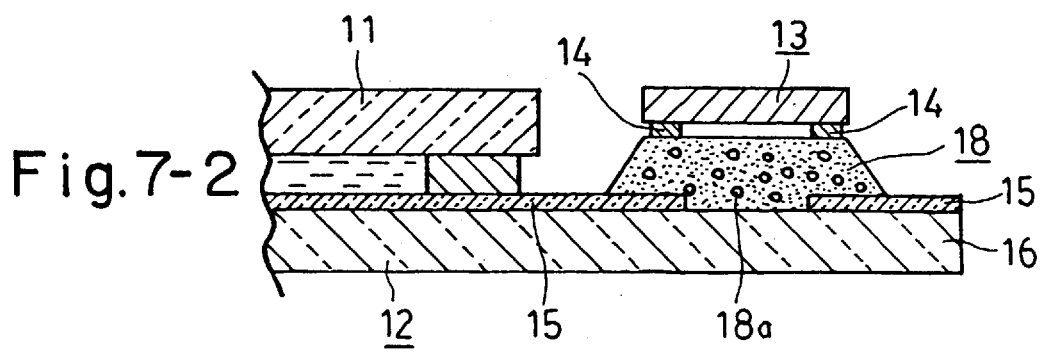
Figures 3, 7:
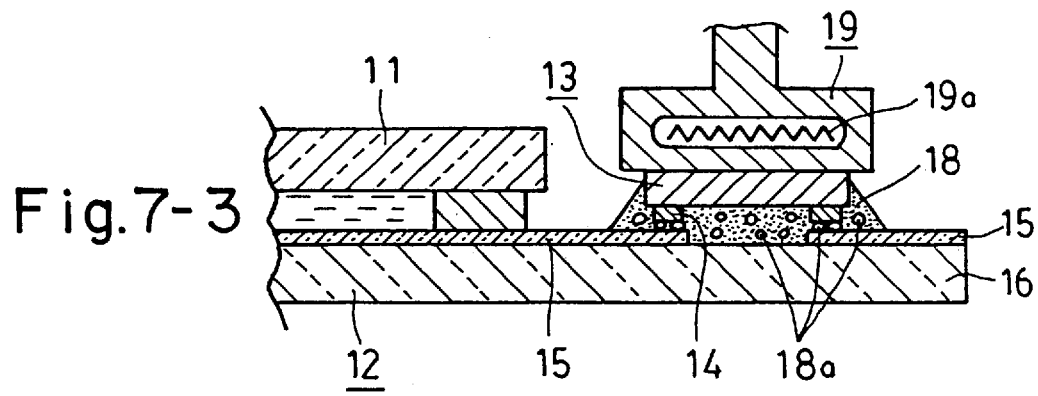
Figures 4, 7:
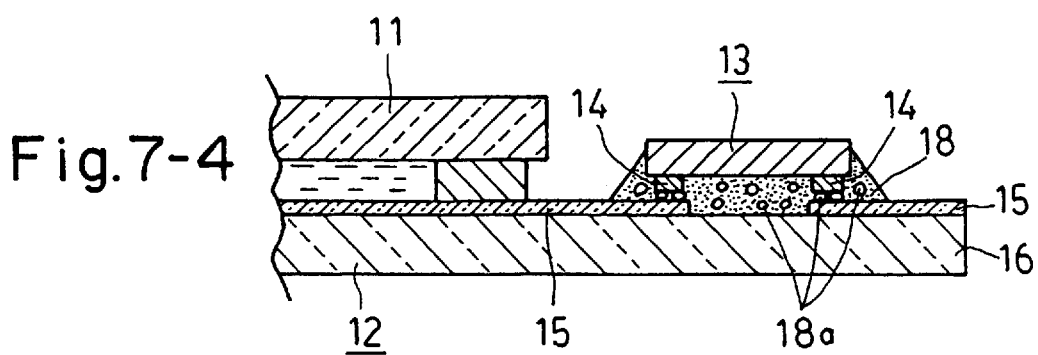
Figure 8:
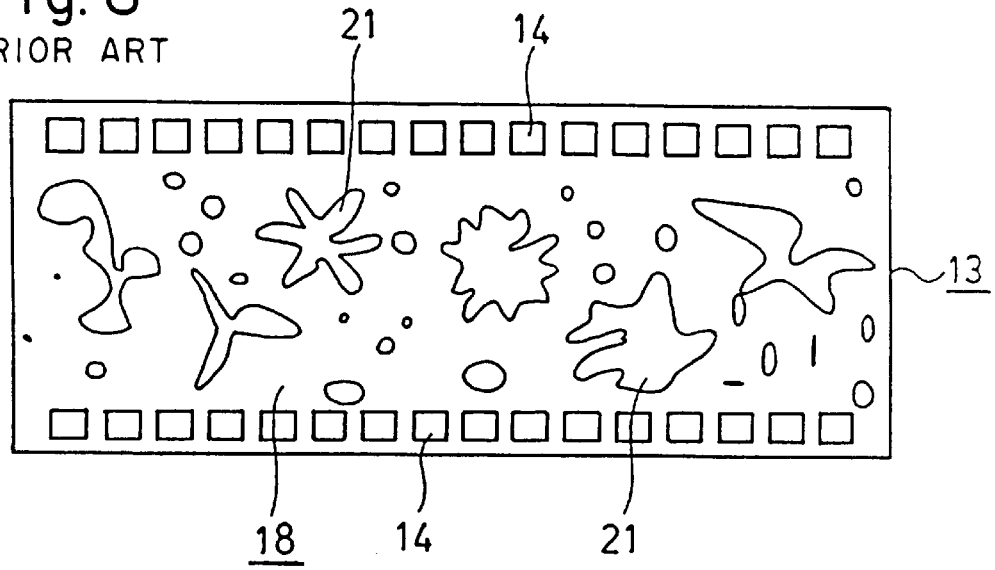
FIG. 8 is a plan view showing the condition of air bubbles generated in an anisotropic conductive adhesive when the conventional mounting method for the semiconductor chip is carried out.

FIGS. 1-1 to 1-4 are sectional views, similar to FIGS. 7-1 to 7-4, showing respective steps of a method for mounting a semiconductor chip according to the first embodiment of the invention, and parts corresponding to those in FIGS. 7-1 to 7-4 are denoted by the same reference numerals.

As shown in FIGS. 1-1 to 1-4, in Step 1, an anisotropic conductive adhesive 18 is disposed on portions of blank spaces 16 of a second substrate 12, (hereinafter referred to merely as a substrate), making up a circuit board of the liquid crystal panel cell, where a semiconductor chip 13 is to be mounted.

Figure 11:
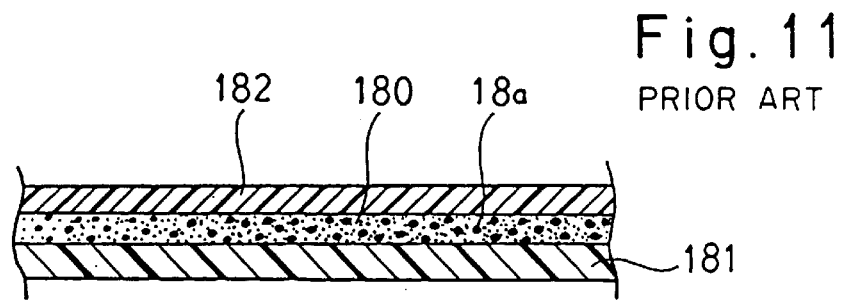
FIG. 11 is a sectional view of an anisotropic conductive film as an example of the anisotropic conductive adhesive.
Figure 12:
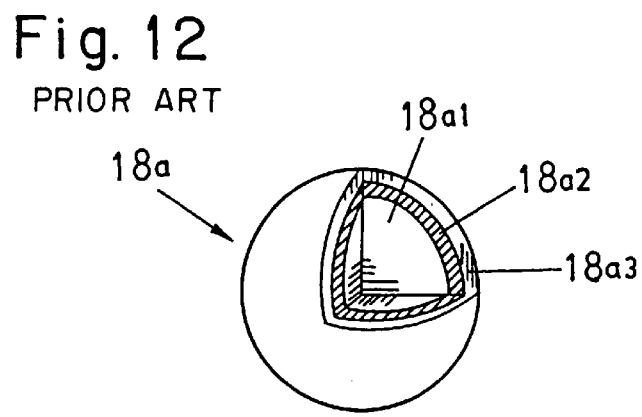
FIG. 12 is an enlarged and partially cutaway perspective view of an electrically conductive particle contained in the anisotropic conductive film shown in FIG. 11.

The anisotropic conductive adhesive 18 may be disposed by bonding the anisotropic conductive film (ACF) shown in FIG. 11 onto the substrate so as to be transferred. However, it may also be disposed by printing the same in paste-like form, or by applying the same thereto, using a dispenser robot with the use of a heating head, heated to a temperature in the range of 80 to 100° C.

The anisotropic conductive adhesive 18 has a thickness in the range of 20 to 100 $\mu$m, and is transferred to a region as large in size as the semiconductor chip 13 to be mounted, or a region larger in size by about 2 mm than the geometry of the semiconductor chip 13.

As shown in FIG. 1-2, in Step 2, preheating is applied to the under surface of the substrate 12 with the anisotropic conductive adhesive 18 disposed thereon by use of a heating jig 20. The preheating is applied to a temperature ranging from 100° C. to 120° C., lower than the hardening temperature of the anisotropic conductive adhesive 18, for a duration of 5 to 10 seconds.

The heating jig 20 made of stainless steel is provided with a heater 20a built therein, and is positioned such that the region on the substrate 12, where the semiconductor chip 13 is to be mounted, can be entirely heated.

As shown in FIG. 1-3, in Step 3 thereafter, the semiconductor chip 13 is mounted on the substrate 12 via the anisotropic conductive adhesive 18 after aligning bump electrodes 14 formed on the semiconductor chip 13 with wiring patterns 15 formed of a transparent electrode film such as an indium tin oxide (ITO) film, tin oxide film, or the like.

As shown in FIG. 1-4, in Step 4, the semiconductor chip 13 is thermally press-bonded to the glass substrate by applying pressure as well as heat with the use of a heating and pressing jig 19 provided with a heater 19a built therein, thereby hardening the anisotropic conductive adhesive 18.

The thermal press-bonding is applied at a temperature in the range of 150 to 260° C., preferably in the range of 180 to 200° C., and at a pressure in the range of 3 to 20 kg. The pressure can be applied by a driving force of an air cylinder or a motor.

As a result of the steps described above, the semiconductor chip 13 is bonded to the substrate 12, and a plurality of electrically conductive particles 18a are clamped between the respective bump electrodes 14 of the semiconductor chip 13 and the respective wiring patterns 15 formed on the substrate 12, thereby rendering the respective bump electrodes 14 electrically continuous with the respective wiring patterns 15.

Volatile constituents contained in the anisotropic conductive adhesive 18 are evaporated, and air involved in air bubbles is removed therefrom by preheating the substrate with the anisotropic conductive adhesive 18 disposed thereon prior to fully hardening the anisotropic conductive adhesive 18 so that as shown in FIG. 2, there occur very few air bubbles 21 when the anisotropic conductive adhesive 18 is hardened.

Due to the occurrence of fewer air bubbles, adhesive resin of the anisotropic conductive adhesive 18 is more densely filled between the substrate 12 and the semiconductor chip 13 as compared with the case of the conventional mounting method wherein a multitude of air bubbles are formed, thereby increasing adhesive strength, and strengthening the force holding the electrically conductive particles 18a clamped between the bump electrodes 14 and wiring patterns 15. Consequently, contact resistance values become lower and more stable.

In this connection, comparative tests were carried out to compare a case where a semiconductor chip is actually mounted on a circuit board by the conventional method with a case of mounting the same by the method according to the invention. The comparative tests and the results thereof are described hereinafter.

In the tests, substrates were prepared by bonding the anisotropic conductive adhesive to glass substrates with ITO wiring patterns formed thereon so as to be able to measure contact resistance values. In the case of testing the conventional mounting method, after aligning the position of the semiconductor chip on the substrate as it is, the semiconductor chip was heated to about 180° C. for a duration of about 20 seconds, thereby hardening the adhesive.

In the case of testing the mounting method according to the invention, after leaving a glass substrate with the anisotropic conductive adhesive bonded thereto on a hot plate heated to a temperature on the order of 100° C. for about 10 seconds, thereby evaporating volatile constituents contained in the anisotropic conductive adhesive, the position of the semiconductor chip was aligned on the glass substrate, and heated to about 180° C. for a duration of about 20 seconds, thereby hardening the adhesive.

Then, durability tests were carried out on samples prepared by the conventional mounting method and the mounting method according to the invention, respectively, wherein the samples were left in a furnace set in a high temperature and high-moisture atmosphere of 85% humidity at 85° C. for a retention time of 500 hours.

FIG. 3 is a diagram (graph) showing variation in value of contact resistance between bump electrodes of the semiconductor chip and wiring patterns formed on the substrates as measured during the durability tests with reference to the samples prepared by the conventional mounting method and the mounting method according to the invention, respectively.

As is evident from FIG. 3, the contact resistance value of the sample prepared by the conventional mounting method, after the elapse of 500 hours, is found to be about 32Ω, indicating a considerable increase from the initial contact resistance value (about 5Ω) while that of the sample prepared by the method according to the invention is found to be about 10Ω, indicating only a small increase from the initial contact resistance value (about 2Ω).

The results show that the method for mounting the semiconductor chip according to the invention is capable of keeping the contact resistance value at a lower level for a long time than that of the conventional method for mounting the semiconductor chip.

Next, a second embodiment of a method for mounting a semiconductor chip according to the invention will be described taking as an example the case of mounting a semiconductor chip for driving liquid crystals on a liquid crystal panel cell, like the case of the embodiment previously described with reference to FIGS. 5 and 6.

Figure 5:
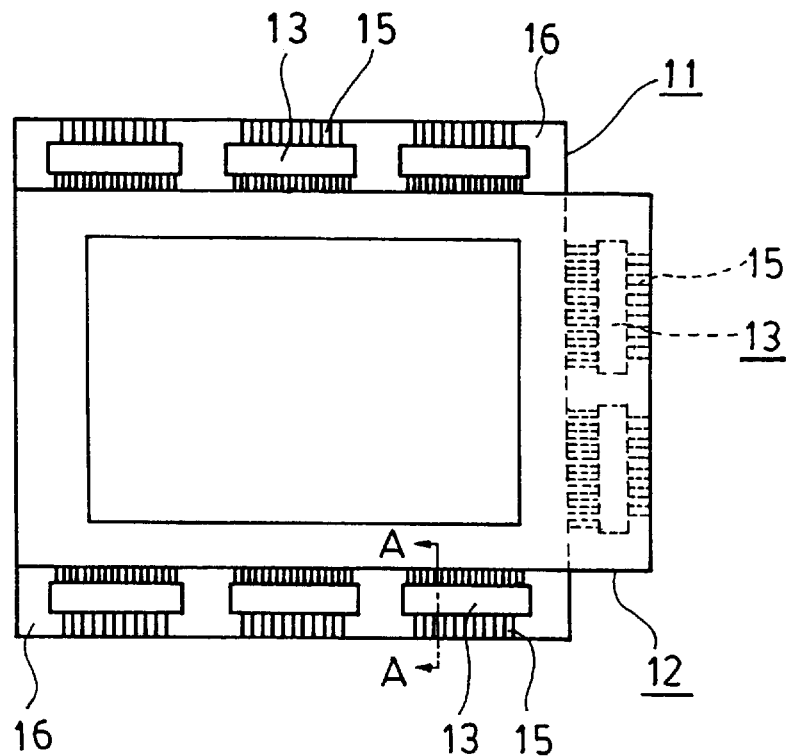
FIG. 5 is a plan view of a liquid crystal display to which the method for mounting the semiconductor chip according to the invention is applied.
Figure 6:
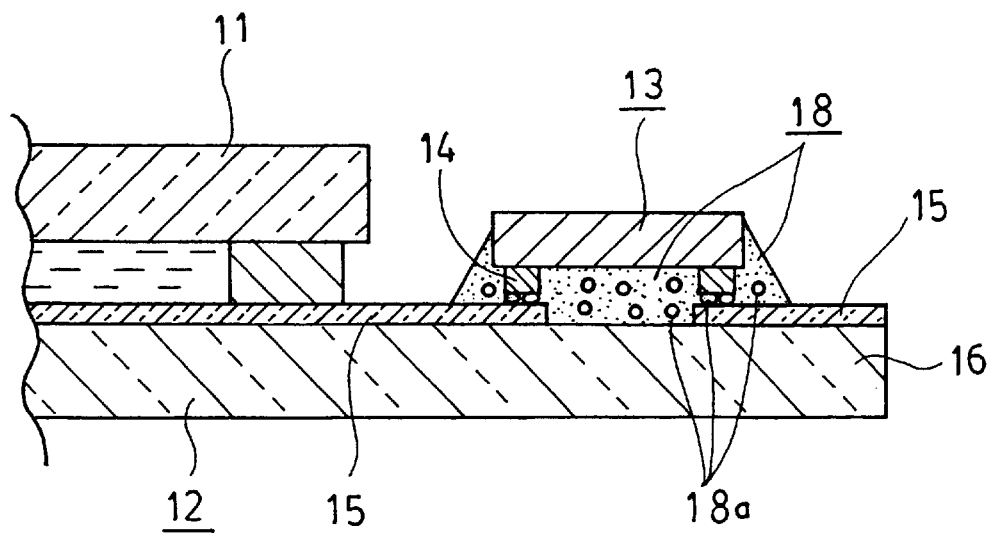
FIG. 6 is a partially enlarged sectional view of the liquid crystal display taken along the line A—A of FIG. 5.

FIGS. 4-1 to 4-4 are sectional views, similar to FIGS. 7-1 to 7-4 and to 1-4, showing respective steps of a method for mounting a semiconductor chip according to the second embodiment of the invention, and corresponds to the sectional view taken along the line A—A of FIG. 5. In FIGS. 4-1 to 4-4, parts corresponding to those in FIGS. 7-1 to 7-4 and 1-1 to 1-4, respectively, are denoted by the same reference numerals.

In the second embodiment, Steps 1 and 2 shown in FIGS. 4-1 and 4-2 are the same as Steps 1 and 2 of the conventional mounting method shown in FIGS. 7-1 and 7-2.

As shown in FIGS. 4-1, in Step 1, an anisotropic conductive adhesive 18 is disposed by means of transferal or the like on portions of blank spaces 16 of a substrate 12, (hereinafter referred to merely as a substrate), making up a circuit board of a liquid crystal panel cell, where a semiconductor chip 13 is to be mounted.

As shown in FIG. 4-2, in Step 2 after aligning bump electrodes 14 of the semiconductor chip 13 with wiring patterns 15 formed on the substrate 12, facing the bump electrodes 14, the semiconductor chip 13 is disposed on the substrate 12, with the anisotropic conductive adhesive 18 interposed therebetween.

As shown in FIG. 4-3, in Step 3, which is a step unique to this embodiment of the invention, when thermally press-bonding the semiconductor chip 13 to the substrate 12 by applying pressure as well as heat, and hardening the anisotropic conductive adhesive 18 by use of a heating and pressing jig 19 provided with a heater 19a built therein, the under surface (a surface on the opposite side of the surface with the semiconductor chip 13 disposed thereon) of the substrate 12 is simultaneously heated by a heating jig 20 with a heater 20a built therein. The temperature at which heating is applied from below, as described above, is lower than that to which the semiconductor chip 13 is heated, and a specific example will be described hereinafter.

As shown in FIG. 4-4 in Step 4, upon hardening of the anisotropic conductive adhesive 18, adhesion of the semiconductor chip 13 onto the substrate 12 is accomplished, rendering the bump electrodes 14 electrically continuous with the wiring patterns 15 by the effect of the electrically conductive particles 18a clamped between the bump electrodes 14 of the semiconductor chip 13 and the wiring patterns 15.

During the thermal press-bonding in Step 3, the semiconductor chip 13 is heated to reach a temperature in the range of 150 to 260° C., preferably, in the range of 180 to 240° C., and a pressure in the range of 1 to 30 kg is applied for a duration of 5 to 10 seconds.

Meanwhile, with the duration of press-bonding ranging from 5 to 10 seconds, the temperature of the substrate 12 rises to only around 100° C.

Figure 9:
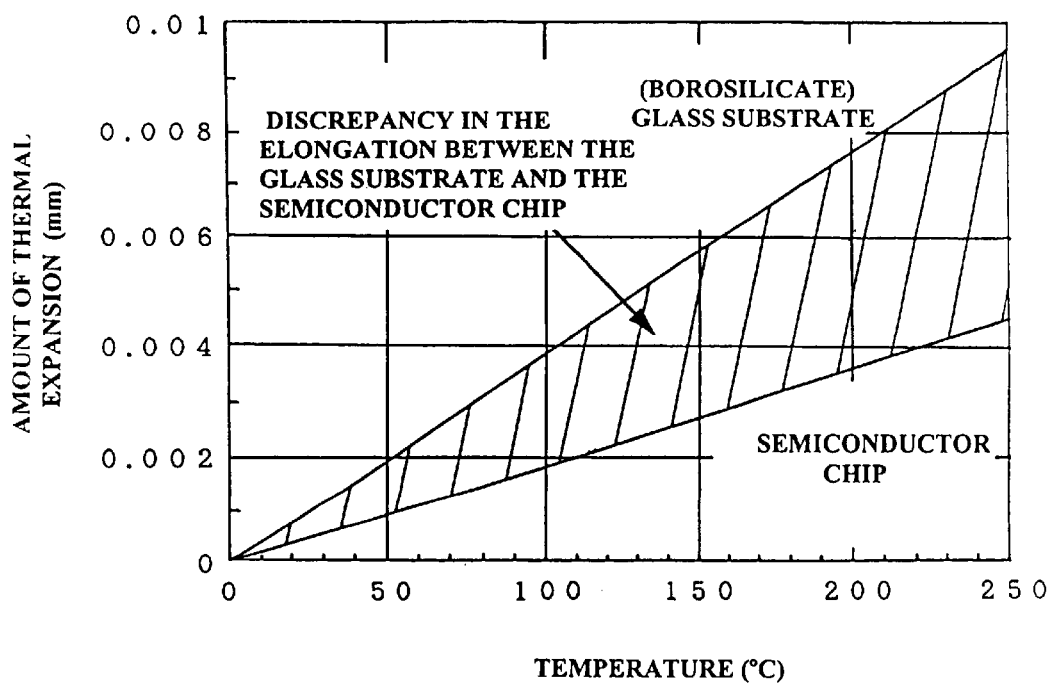
FIG. 9 is a diagram showing a relationship between temperature and an amount of thermal expansion of a borosilicate glass substrate and a semiconductor chip, respectively.

As shown in FIG. 9, when heating up both the substrate 12, which is a borosilicate glass substrate, and the semiconductor chip 13 to an identical temperature, the glass substrate having a greater thermal expansion coefficient undergoes larger elongation than that of the semiconductor chip. The diagonally shaded area in FIG. 9 represents the aggregate amount of discrepancy in thermal expansion between the glass substrate and the semiconductor chip. A discrepancy amounting to 0.005025 mm occurs at 250° C.

In order to eliminate such difference in elongation, the heating jig 20 is disposed on the under surface of the substrate 12 for heating the same so as to be able to adjust the difference in temperature between the semiconductor chip 13 and the substrate 12.

Figure 10:
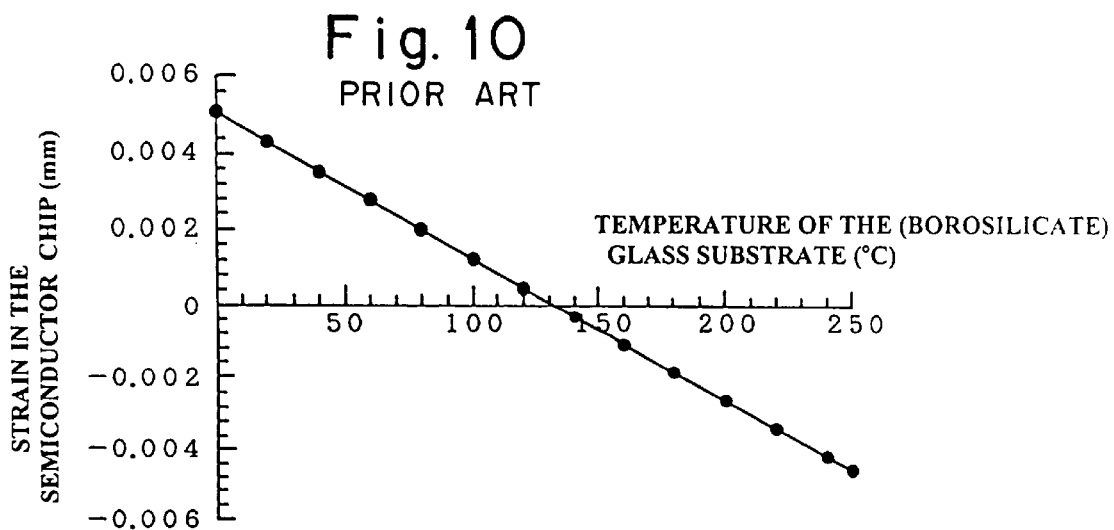
FIG. 10 is a diagram showing a relationship between various temperatures of the borosilicate glass substrate and thermal strain of the semiconductor chip heated to 250° C.

Based on the diagram (graph) shown in FIG. 10, indicating the relationship between temperatures of the glass substrate and magnitude of thermal strain of the semiconductor chip 13 heated up to 250° C., the degree to which heating of the substrate 12, that is, the glass substrate, must be performed to eliminate the strain when the semiconductor chip 13 is heated up to 250° C. can be found.

The thermal strain is reduced to nearly zero by heating the substrate 12 to about 130° C. This point is further explained hereinafter referring to numerical values.

Assuming that room temperature is set at 20° C., the elongation occurring in the glass substrate and the semiconductor chip, respectively, is calculated as follows. If calculation is made for one half of respective members on one side only assuming that the semiconductor chip has a side 15 mm long, and elongation caused by thermal expansion occurs bisymmetrically, the elongation of the semiconductor chip 13 heated up to 250° C. is found by the following formula:

$$(15 \text{ mm} \div 2) \times 24.2 \times 10^{-7} \times (250° \text{ C.} - 20° \text{ C.}) = 0.0041745 \text{ mm}.$$

In this instance, the elongation of the substrate 12 heated to 130° C. is found by the following formula:

$$(15 \text{ mm} \div 2) \times 51 \times 10^{-7} \times (130° \text{ C.} - 20° \text{ C.}) = 0.0042075 \text{ mm}.$$

Accordingly, the amount of discrepancy in thermal expansion between the glass substrate and the semiconductor chip is given as follows, enabling the thermal strain to be reduced to nearly zero:

$$0.0041745 \text{ mm} - 0.0042075 \text{ mm} = 0.0000330 \text{ mm}.$$

Then, by calculation, it can be found that the thermal strain can be completely eliminated by heating the substrate 12 to about 129.1372° C.

It can be said from above results that when mounting a semiconductor chip for driving liquid crystals on a borosilicate glass substrate, the glass substrate may preferably be heated to about 130° C. by use of a heating jig.

Even in the case where a semiconductor chip is mounted on a circuit board composed of another material having a different thermal expansion coefficient, or in the case where another anisotropic conductive adhesive having a different curing temperature is used, the semiconductor chip can be mounted without causing thermal strain by adjusting the temperature on the side of the circuit board after calculating a temperature at which thermal shrinkage of the circuit board becomes the same as that of the semiconductor chip on the basis of the thermal expansion coefficients of the materials used.

Further, a third embodiment of a method for mounting a semiconductor chip according to the invention can be carried out by combining the first embodiment with the second embodiment described in the foregoing.

That is, Step 3 of the method for mounting the semiconductor chip according to the first embodiment of the invention as shown in FIG. 1-3 may be substituted by Step 4 of the second embodiment as illustrated in FIG. 4-4.

More specifically, in Step 2, the substrate 12 with the anisotropic conductive adhesive 18 disposed thereon is preheated to a temperature lower than the hardening temperature of the anisotropic conductive adhesive 18 by use of the heating jig 20, and in Step 3 of hardening the anisotropic conductive adhesive, the substrate 12 is heated from the under surface side thereof as well by use of the heating jig 20 to a temperature lower than the heating temperature to which the semiconductor chip 13 is heated by use of the heating jig 19.

This will substantially eliminate generation of air bubbles between the anisotropic conductive adhesive 18 and the semiconductor chip 13 as well as the substrate 12, and thermal strain between the substrate 12 and the semiconductor chip 13 is also inhibited, thereby also enabling attainment of reliable mounting.

As described hereinbefore, in the method for mounting the semiconductor chip according to the invention, the anisotropic conductive adhesive is heated prior to disposing the semiconductor chip on the circuit board so as to evaporate volatile constituents contained in the adhesive, and then, the semiconductor chip is mounted on and thermally press-bonded to the substrate, thereby inhibiting generation of air bubbles when hardening the anisotropic conductive adhesive. This will enable adhesive strength to be enhanced so that highly reliable mounting of the semiconductor chip on the circuit board can be carried out.

Further, during the step of thermally press-bonding the semiconductor chip, the difference in elongation between the circuit board and the semiconductor chip due to the difference in thermal expansion coefficient therebetween can be eliminated by thermally press-bonding the semiconductor chip while heating the circuit board from the side of the under surface thereof so that an excellent connection without thermal strain can be attained when the temperatures of the circuit board and the semiconductor chip return to room temperature after completion of the step of hardening the anisotropic conductive adhesive by heating.

It is thus also possible to achieve reliable mounting of the semiconductor chip on the circuit board by applying both steps as described above.

What is claimed is:

1. A method for mounting a semiconductor chip provided with bump electrodes on a circuit board with wiring patterns formed thereon;

said method for mounting the semiconductor chip comprising:
a step of disposing a thermosetting anisotropic conductive adhesive on the circuit board;
a step of preheating the circuit board with the anisotropic conductive adhesive on the circuit board to a temperature lower than the hardening temperature of the anisotropic conductive adhesive;
a step of disposing the semiconductor chip on the circuit board after the preheating step and after aligning the bump electrodes of the semiconductor chip with the wiring patterns formed on the circuit board; and
a step of hardening the thermosetting anisotropic conductive adhesive by thermally press-bonding the semiconductor chip onto the circuit board by applying pressure as well as heat to said semiconductor chip.

2. A method for mounting a semiconductor chip provided with bump electrodes on a circuit board with wiring patterns formed thereon;

said method for mounting the semiconductor chip comprising:
a step of disposing a thermosetting anisotropic conductive adhesive on the circuit board;

a step of disposing the semiconductor chip on the circuit board after aligning the bump electrodes of the semiconductor chip with the wiring patterns formed on the circuit board; and a step of hardening the thermosetting anisotropic conductive adhesive by thermally press-bonding the semiconductor chip onto the circuit board by applying pressure as well as heat to said semiconductor chip, and by simultaneously heating a surface of the circuit board opposite said thermosetting anisotropic conductive adhesive with the semiconductor chip disposed on the circuit board to a temperature lower than a temperature to which the semiconductor chip is heated.

3. A method for mounting a semiconductor chip provided with bump electrodes on a circuit board with wiring patterns formed thereon;

said method for mounting the semiconductor chip comprising:

a step of disposing a thermosetting anisotropic conductive adhesive on the circuit board;

a step of preheating the circuit board with the thermosetting anisotropic conductive adhesive disposed thereon to a temperature lower than the hardening temperature of the thermosetting anisotropic conductive adhesive;

a step of disposing the semiconductor chip on the circuit board after aligning the bump electrodes of the semiconductor chip with the wiring patterns formed on the circuit board; and a step of hardening the thermosetting anisotropic conductive adhesive by thermally press-bonding the semiconductor chip onto the circuit board by applying pressure as well as heat to said semiconductor chip, and by simultaneously heating a surface of the circuit board opposite said thermosetting anisotropic conductive adhesive with the semiconductor chip disposed on the circuit board to a temperature lower than a temperature to which the semiconductor chip is heated.

* * * * *